United States Patent
Jang et al.

(10) Patent No.: US 10,887,845 B2
(45) Date of Patent: Jan. 5, 2021

(54) RADIO FREQUENCY INTEGRATED CIRCUIT INCLUDING A LOCAL OSCILLATOR AND OPERATING METHOD THEREOF

(71) Applicant: SAMSUNG ELECTRONICS CO., LTD., Suwon-si (KR)

(72) Inventors: Jae-Hyuk Jang, Hwaseong-si (KR); Jung-Woo Kim, Seoul (KR); Chul-Ho Kim, Hwaseong-si (KR); Joon-Hee Lee, Goyang-si (KR); Sang-Wook Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/502,937

(22) Filed: Jul. 3, 2019

(65) Prior Publication Data
US 2020/0022091 A1 Jan. 16, 2020

(30) Foreign Application Priority Data
Jul. 16, 2018 (KR) ........................ 10-2018-0082205

(51) Int. Cl.
*H03B 27/00* (2006.01)
*H04W 52/24* (2009.01)
*H04B 1/40* (2015.01)

(52) U.S. Cl.
CPC ............ *H04W 52/243* (2013.01); *H04B 1/40* (2013.01)

(58) Field of Classification Search
CPC ... H04L 27/22; H04L 25/00; H04L 25/03834; H04L 25/4902; H04L 27/0014; H04L 27/127; H04L 2025/03356; H04L 25/022; H04L 25/03828; H04L 27/152; H04W 56/0035; H03B 2200/009; H03B 2202/05; H03B 27/00
USPC ........................................................ 455/85
See application file for complete search history.

(56) References Cited

U.S. PATENT DOCUMENTS

| 7,755,630 | B2 | 7/2010 | Woo |
| 8,073,416 | B2 | 12/2011 | Sun et al. |
| 8,472,890 | B2 | 6/2013 | Zhuo et al. |
| 8,929,840 | B2 | 1/2015 | Aniruddhan et al. |
| 9,112,508 | B2 | 8/2015 | Chang et al. |

(Continued)

FOREIGN PATENT DOCUMENTS

| KR | 10-2005-0018443 | 2/2005 |
| KR | 10-0707203 | 4/2007 |
| KR | 10-2017-0124017 | 11/2017 |

*Primary Examiner* — Tu X Nguyen
(74) *Attorney, Agent, or Firm* — F. Chau & Associates, LLC

(57) ABSTRACT

In an operating method of a radio frequency integrated circuit (RFIC) including a transmission circuit and a reception circuit, the operating method includes receiving, from a modem, first information for setting transmission power of the transmission circuit or second information about a blocker which is a frequency signal unused by the RFIC, obtaining an allowable value of phase noise of a local oscillator included in the transmission circuit, using the first information, obtaining an allowable value of phase noise of a local oscillator included in the reception circuit, using the second information, determining a level of a driving voltage, using the obtained allowable values of the phase noises, and providing the driving voltage to the local oscillators.

19 Claims, 11 Drawing Sheets

(56) References Cited

U.S. PATENT DOCUMENTS

| | | |
|---|---|---|
| 9,258,021 B1 | 2/2016 | Rajavi et al. |
| 9,891,855 B2 | 2/2018 | Yang et al. |
| 2009/0253382 A1* | 10/2009 | Haralabidis ............ H04B 1/005 455/73 |
| 2017/0293340 A1 | 10/2017 | Park et al. |

* cited by examiner

RADIO FREQUENCY INTEGRATED CIRCUIT INCLUDING A LOCAL OSCILLATOR AND OPERATING METHOD THEREOF

CROSS-REFERENCE TO RELATED APPLICATION

This application claims priority under 35 U.S.C. § 119 to Korean Patent Application No. 10-2018-0082205, filed on Jul. 16, 2018 in the Korean Intellectual Property Office, the disclosure of which is incorporated by reference herein in its entirety.

TECHNICAL FIELD

Exemplary embodiments of the inventive concept relate to wireless communication, and more particularly, to a radio frequency integrated circuit (RFIC) including a local oscillator and an operating method of the RFIC.

DISCUSSION OF RELATED ART

Apparatuses for wireless communication may include a transmission circuit which provides a signal of a radio frequency (RF) band to an antenna and a reception circuit which receives the signal of the RF band from the antenna to provide a signal of a baseband or an intermediate frequency band. Each of the transmission circuit and the reception circuit may include elements (for example, a power amplifier, a mixer, etc.) for converting a signal having a certain frequency into a signal having another frequency. The transmission circuit mixes a frequency of the baseband with an output frequency of a local oscillator by using a mixer to generate a frequency of the RF band. On the other hand, the reception circuit mixes the frequency of the RF band with the output frequency of the local oscillator by using the mixer to generate a frequency of the baseband or the intermediate frequency band. Here, an output signal of each of the local oscillators may include phase noise. To reduce the phase noise, a driving voltage of the local oscillator may be increased, but due to this, power consumption also increases.

SUMMARY

According to an exemplary embodiment of the inventive concept, in an operating method of a radio frequency integrated circuit (RFIC) including a transmission circuit and a reception circuit, the operating method including receiving, from a modem, first information for setting transmission power of the transmission circuit or second information about a blocker which is a frequency signal unused by the RFIC, obtaining an allowable value of phase noise of a local oscillator included in the transmission circuit, using the first information, obtaining an allowable value of phase noise of a local oscillator included in the reception circuit, using the second information, determining a level of a driving voltage, using the obtained allowable values of the phase noises, and providing the driving voltage to the local oscillators.

According to an exemplary embodiment of the inventive concept, a local oscillator for providing a clock signal for a frequency conversion operation of a transmission circuit or a reception circuit includes a buffer configured to receive and buffer a clock source signal to provide a clock buffer signal, a divider configured to divide the clock buffer signal to provide a clock signal to a mixer, a voltage selector configured to output a selection voltage, based on transmission power of the transmission circuit or a level of a blocker which is a frequency signal unused by the transmission circuit and the reception circuit, and a voltage regulator configured to provide the buffer and the divider with a driving voltage based on the selection voltage.

According to an exemplary embodiment of the inventive concept, an RFIC includes a local oscillator including a buffer configured to receive and buffer a clock source signal to provide a clock buffer signal, a divider configured to divide the clock buffer signal to provide a clock signal to a mixer, and a voltage selector configured to control a driving voltage provided to the buffer and the divider, and a control logic configured to control the voltage selector, based on an allowable value of phase noise of the local oscillator based on a communication environment of the RFIC.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
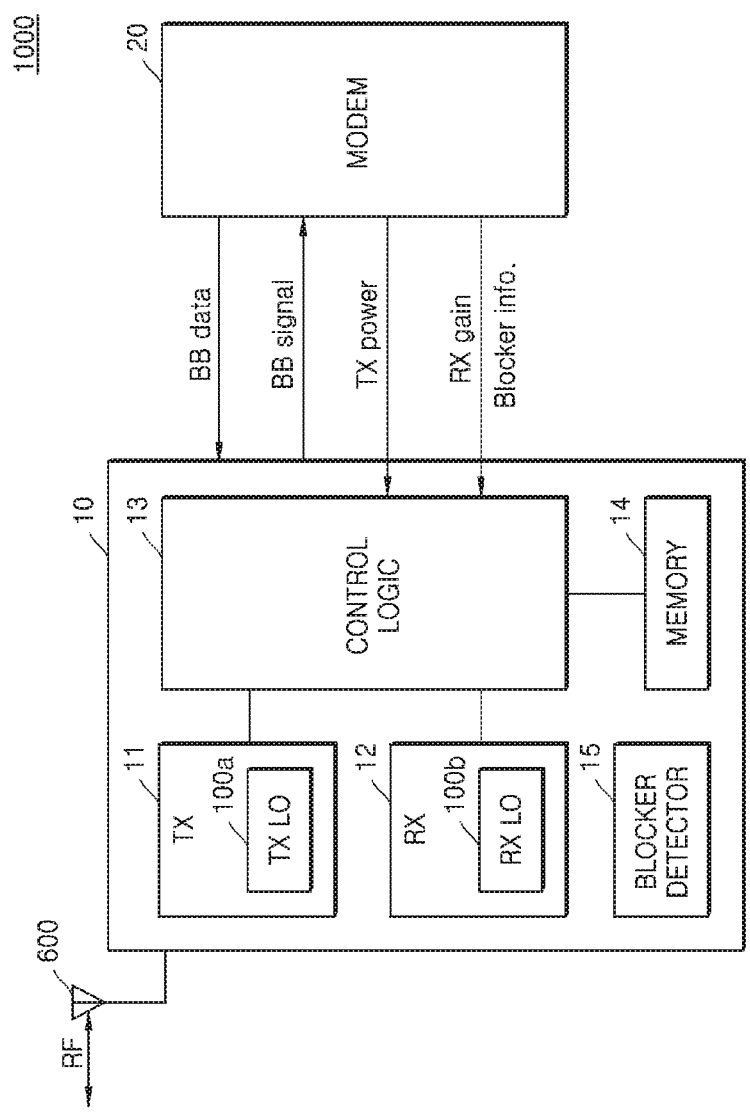
FIG. 1 is a block diagram for describing a wireless communication system according to an exemplary embodiment of the inventive concept.

Exemplary embodiments of the inventive concept provide a radio frequency integrated circuit (RFIC) and an operating method thereof, which optimize a level of a driving voltage provided to a local oscillator to decrease power consumption and phase noise.

Hereinafter, exemplary embodiments of the inventive concept will be described in detail with reference to the accompanying drawings. Like reference numerals may refer to like elements throughout this application.

FIG. 1 is a block diagram for describing a wireless communication system according to an exemplary embodiment of the inventive concept.

Referring to FIG. 1, a communication apparatus (or a wireless communication apparatus) 1000 may correspond to one of various equipment for performing communication, and for example, may be defined as mobile or fixed user equipment (UE), a mobile station (MS), or an advanced mobile station (AMS). Examples of UE may include smartphones, tablet personal computers (PCs), personal computers (PCs), mobile phones, video phones, e-book readers, and netbook PCs.

The communication apparatus 1000 may include a radio frequency integrated circuit (RFIC) 10 and a modem 20. The RFIC 10 may be connected to an antenna 600 to process a signal of a high frequency (for example, radio frequency (RF)) band, and the modem 20 may process a signal of a baseband. For example, the RFIC 10 may convert a high frequency signal, received through the antenna 600, into a low frequency signal, and may transmit the low frequency signal to the modem 20. Additionally, the RFIC 10 may receive a low frequency signal from the modem 20, convert the received low frequency signal into a high frequency signal, and transmit the high frequency signal to the outside through the antenna 600. For example, each of the high frequency signals may be an RF signal, and each of the low frequency signals may be a baseband signal.

The communication apparatus 1000 may further generate an intermediate frequency (IF) signal in a frequency conversion process, and in this case, the communication apparatus 1000 may further include an IF signal processor. A function of the IF signal processor may be implemented in the RFIC 10 and may be controlled by the modem 20.

The RFIC 10 may include a transmission circuit 11, a reception circuit 12, a control logic 13, a memory 14, and a blocker detector 15. The transmission circuit 11 may include a transmission local oscillator 100a, and the reception circuit 12 may include a reception local oscillator 100b.

In a process of transmitting data, the RFIC 10 may receive baseband data (BB data) from the modem 20 and may mix an output signal of the transmission local oscillator 100a with the baseband data (BB data). A mixed signal may be output as an RF signal to the outside through the antenna 600. In a process of receiving data, the RFIC 10 may receive an RF signal from the outside and may mix an output signal of the reception local oscillator 100b with the received RF signal. A mixed signal may be output as a baseband signal (BB signal) to the modem 20.

The transmission circuit 11 may amplify and output an RF signal, based on transmission power value, and the reception circuit 12 may receive an RF signal and may amplify the received RF signal, based on a reception gain value. To this end, the RFIC 10 may receive information (TX power), which is used to set transmission power of the transmission circuit 11, from the modem 20, and/or may receive information (RX gain) for setting a reception gain of the reception circuit 12. For example, the transmission power may include output power of an amplifier included in the transmission circuit 11, and the reception gain may include a gain of an amplifier included in the reception circuit 12.

The RFIC 10 may receive information (Blocker info.) about a blocker from the modem 20, and the control logic 13 may obtain a blocker level, based on the information (Blocker info.) about the blocker. Here, the blocker may denote all frequency signals other than a frequency signal used by the communication apparatus 1000, and for example, may denote a frequency signal used by other communication apparatuses, instead of the frequency signal used by the communication apparatus 1000. In other words, in terms of the communication apparatus 1000, the blocker may be a generic name for signals which hinder communication. The blocker may be a frequency signal used for another purpose and may have a higher level than that of general noise.

According to an exemplary embodiment of the inventive concept, the RFIC 10 may detect a blocker from an RF signal received through the antenna 600 by using the blocker detector 15 thereof, and may transmit the detected blocker and a baseband signal to the modem 20. For example, the blocker detector 15 may be provided as a separate circuit in the RFIC 10.

The blocker detector 15 may analyze the received RF signal to identify, as the blocker, another frequency component other than a frequency of an RF signal which is used for the RFIC 10 to perform communication. For example, the blocker detector 15 may obtain frequency band information corresponding to a frequency signal receivable by the RFIC 10 from the modem 20 and may detect the blocker, based on the frequency band information.

The blocker detector 15 may transmit information, indicating that the other frequency component has been identified as the blocker, to the modem 20. The modem 20 may calculate the information (Blocker info.) about various blockers such as a frequency value, a level, a phase, or the like of the blocker, based on the information received from the blocker detector 15.

The modem 20 may perform an operation of generating the information (Blocker info.) about the blocker, based on the baseband, and may transmit, to the RFIC 10, the information (RX gain) for setting the reception gain which varies based on blockers. In other words, the information (RX gain) for setting the reception gain may include the information (Blocker info.) about the blocker. When the information (RX gain) for setting the reception gain is received from the modem 20, the control logic 13 may analyze the received information (RX gain) for setting the reception gain to obtain a blocker level. According to an exemplary embodiment of the inventive concept, the control logic 13 may individually receive the information (Blocker info.) about the blocker and the information (RX gain) for setting the reception gain.

An allowable value of phase noise of the transmission local oscillator 100a may be determined based on the transmission power of the transmission circuit 11. Additionally, an allowable value of phase noise of the reception local oscillator 100b may be determined based on a blocker level.

Phase noise may be an undesired phase component. For example, phase noise may be caused by an internal design factor of a local oscillator, and may denote that a jitter of a time domain is expressed in a frequency domain. For example, when the transmission power of the transmission circuit 11 is high, a low level of phase noise occurring in the transmission local oscillator 100a may be needed, and when a blocker level is high, a low level of phase noise occurring in the reception local oscillator 100b may be needed. This will be described below with reference to FIGS. 4 and 6.

The RFIC 10 may have transmission power, a reception gain, and a blocker level which vary based on a communication environment including a distance between base stations and a communication standard (for example, $3^{rd}$ generation (3G), $4^{th}$ generation (4G), or the like). Therefore, when the communication environment is changed, phase noise needed for each of the transmission local oscillator 100*a* and the reception local oscillator 100*b* may vary.

For this reason, the control logic 13 may receive, from the modem 20, the information (TX power) for setting the transmission power of the transmission circuit 11 and the information (Blocker info.) about the blocker. Additionally, the control logic 13 may calculate the allowable value of the phase noise of the transmission local oscillator 100*a*, based on the information (TX power) for setting the transmission power, and may calculate the allowable value of the phase noise of the reception local oscillator 100*b*, based on the information (Blocker info.) about the blocker or the information (RX gain) for setting the reception gain. The control logic 13 may control the transmission circuit 11 to provide a driving voltage having an optimal level to the transmission local oscillator 100*a*, based on the calculated allowable value of the phase noise of the transmission local oscillator 100*a*, and may control the reception circuit 12 to provide a driving voltage having an optimal level to the reception local oscillator 100*b*, based on the calculated allowable value of the phase noise of the reception local oscillator 100*b*.

The control logic 13 may increase a driving voltage provided from a local oscillator, for decreasing phase noise. However, when desired phase noise is large, a driving voltage having a relatively low level may be provided to the local oscillator.

On the other hand, in the related art, the driving voltage is maintained at a high level for minimizing phase noise. Due to this, in the related art, power consumption efficiency is reduced.

Therefore, the control logic 13 according to an exemplary embodiment of the inventive concept may control the transmission circuit 11 and the reception circuit 12 to provide a minimum driving voltage suitable for an allowable value of desired phase noise by using a predetermined operational equation or a lookup table stored in the memory 14, based on the communication environment or an operating condition. According to an exemplary embodiment of the inventive concept, the modem 20 may directly control the transmission circuit 11 and the reception circuit 12 to provide a minimum driving voltage suitable for an allowable value of desired phase noise, based on the communication environment or the operating condition.

According to an exemplary embodiment of the inventive concept, the memory 14 may store at least one of a first lookup table where phase noise levels of the local oscillators 100*a* and 100*b* are mapped to driving voltage levels of the local oscillators 100*a* and 100*b*, a second lookup table where a transmission power level of the transmission circuit 11 is mapped to the allowable value of the phase noise of the transmission local oscillator 100*a*, and a third lookup table where a blocker level of the reception circuit 12 is mapped to the allowable value of the phase noise of the reception local oscillator 100*b*. The second lookup table may store pieces of data where the allowable value of the phase noise of the transmission local oscillator 100*a* is reduced as the transmission power level increases. The third lookup table may store pieces of data where the allowable value of the phase noise of the reception local oscillator 100*b* is reduced as the blocker level increases. The first lookup table may store the driving voltage levels corresponding to the phase noise levels of the local oscillators 100*a* and 100*b*.

The memory 14 may be implemented with dynamic random access memory (DRAM), static random access memory (SRAM), flash memory, phase-change random access memory (PRAM), resistive random access memory (ReRAM), magnetoresistive random access memory (MRAM), or another type of memory device.

According to an exemplary embodiment of the inventive concept, based on the information (TX power) which is used to set the transmission power and received from the modem 20, the control logic 13 may set the transmission power of the transmission circuit 11 and may obtain an allowable value, corresponding to transmission power level, of phase noise of the transmission circuit 11 by using the second lookup table. Alternatively, based on the blocker information (Blocker info.) received from the modem 20, the control logic 13 may obtain an allowable value, corresponding to a blocker level, of phase noise of the reception circuit 12 by using the third lookup table.

Subsequently, by using the first lookup table, the control logic 13 may obtain driving voltages, corresponding to the obtained allowable values of the phase noises, of the local oscillators 100*a* and 100*b*. Accordingly, each of the local oscillators 100*a* and 100*b* may be provided with a driving voltage having a minimum driving voltage level so as to have an allowable value of phase noise that is acceptable.

The transmission local oscillator 100*a* and the reception local oscillator 100*b* may be implemented as separate local oscillators, but are not limited thereto. For example, one local oscillator included in one RFIC 10 may provide a signal, which is to be mixed, to the transmission circuit 11 and the reception circuit 12.

Figure 2:
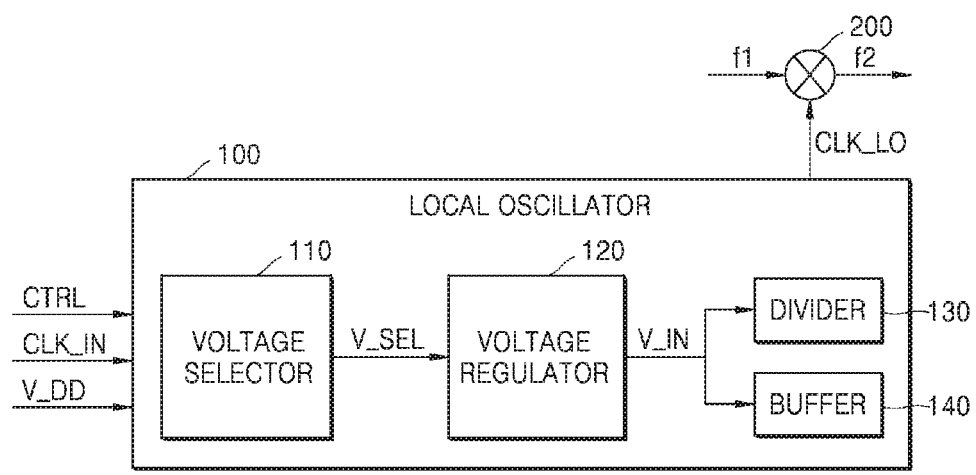
FIG. 2 is a block diagram for describing a local oscillator according to an exemplary embodiment of the inventive concept.

FIG. 2 is a block diagram for describing a local oscillator according to an exemplary embodiment of the inventive concept.

Referring to FIG. 2, a local oscillator 100 may include a voltage selector 110, a voltage regulator 120, a divider 130, and a buffer 140. The transmission local oscillator 100*a* and the reception local oscillator 100*b* described above with reference to FIG. 1 may be implemented as the local oscillator 100. Additionally, for convenience of description, reference numerals of FIG. 1 may be used.

The local oscillator 100 may receive a control signal CTRL and a clock source signal CLK_IN, and may be supplied with a source voltage V_DD. The voltage selector 110 may generate a selection voltage V_SEL, and may provide the selection voltage V_SEL to the voltage regulator 120, based on the control signal CTRL received from the control logic 13.

As the transmission power of the transmission circuit 11 decreases, the voltage selector 110 may provide the selection voltage V_SEL at a low level, and as a level of a blocker decreases, the voltage selector 110 may provide the selection voltage V_SEL at a low level. This is because, when the transmission power and the level of the blocker are low, phase noise occurring in the local oscillator 100 is high. The phase noise occurring in the local oscillator 100 may be determined based on a level of a driving voltage V_IN provided to the divider 130 and the buffer 140, and the driving voltage V_IN may have a value which varies based on the selection voltage V_SEL. In other words, the selection voltage V_SEL having a low level (e.g., below a predetermined threshold) results in the driving voltage V_IN having a low level (e.g., below a predetermined threshold).

For example, the modem 20 may transmit transmission power information, which allows the transmission power of the RFIC 10 to have a small value, to the RFIC 10 in a first communication environment (for example, a case where a distance to a base station is short). Since the transmission power of the transmission circuit 11 has the small value, the phase noise occurring in the local oscillator 100 may have a first allowable value which is relatively large. Since the phase noise occurring in the local oscillator 100 has a first allowable value which is relatively large, the voltage selector 110 may provide the voltage regulator 120 with the selection voltage V_SEL having a first voltage value which is relatively low. In other words, when the phase noise has a relatively large value, the voltage selector 110 may provide a low voltage to reduce power consumed by the local oscillator 100.

The voltage regulator 120 may receive the selection voltage V_SEL to apply the driving voltage V_IN, which has been stably adjusted, to the divider 130 and the buffer 140. The buffer 140 may have an operation point determined based on the applied driving voltage V_IN. The buffer 140 may process the clock source signal CLK_IN to have a waveform which is the same as or similar to a square wave, based on the operation point and may provide a processed clock source signal CLK_IN to the divider 130. The divider 130 may divide a signal received from the buffer 140 to provide a clock signal CL_LO to a mixer 200. The mixer 200 may mix the clock signal CLK_LO with a first frequency signal f1 to output a second frequency signal f2.

Figure 3:
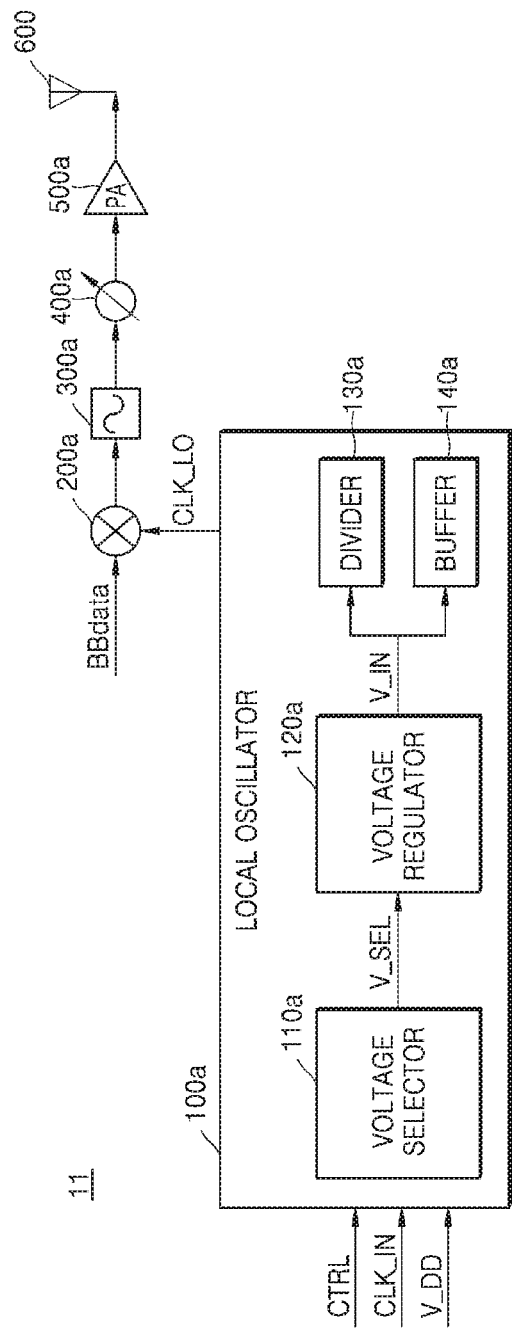
FIG. 3 is a block diagram for describing a local oscillator of a transmission circuit according to an exemplary embodiment of the inventive concept.

FIG. 3 is a block diagram for describing a local oscillator of a transmission circuit according to an exemplary embodiment of the inventive concept.

Referring to FIG. 3, the transmission circuit 11 may include the transmission local oscillator 100a, a mixer 200a, a filter 300a, a phase shifter 400a, and a power amplifier 500a. The transmission local oscillator 100a may perform an operation which is the same as or similar to the local oscillator 100 described above with reference to FIG. 2, and thus, repetitive descriptions will be omitted.

The mixer 200a may mix the baseband data (BB data) with the clock signal CLK_LO output from the transmission local oscillator 100a to output an RF signal to the filter 300a. For example, the mixer 200a may perform frequency up-conversion on the baseband data (BB data) by using the clock signal CLK_LO.

The power amplifier 500a may adjust transmission power according to control by the control logic 13 of FIG. 1 and may transmit the adjusted transmission power to the antenna 600. In detail, the control logic 13 may process information which is provided by the modem 20 and is used to set the transmission power, and may control a level of power of a signal which is to be transmitted by the power amplifier 500a, based on the information provided by the modem 20. In this case, transmission power which is to be output by the power amplifier 500a may vary based on a communication environment including a communication standard and a distance between a communication apparatus and a base station. A relationship between transmission power and phase noise will be described below with reference to FIG. 4.

Figure 4:
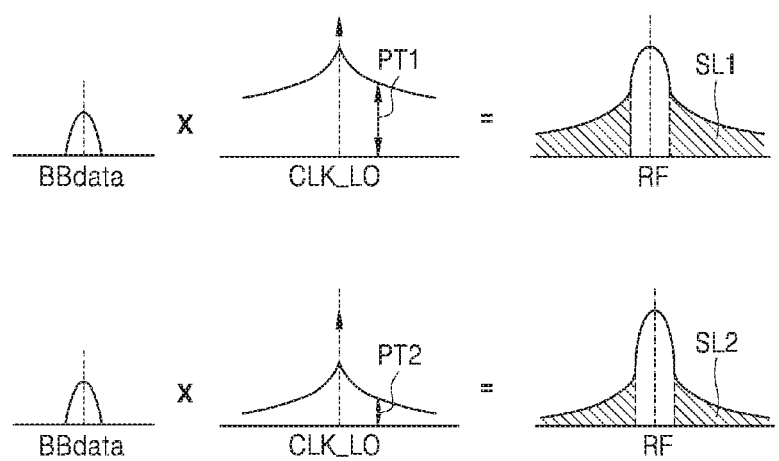
FIG. 4 is a diagram for describing a phase noise-based effect of a transmission circuit according to an exemplary embodiment of the inventive concept.

FIG. 4 is a diagram for describing a phase noise-based effect of a transmission circuit according to an exemplary embodiment of the inventive concept. For convenience, the following description will be given with reference to reference numerals of FIG. 3.

Referring to FIG. 4, the mixer 200a may mix the baseband data (BB data) with the clock signal CLK_LO to output an RF signal. In FIG. 4, the abscissa axis of a graph represents frequency, and the ordinate axis represents power.

The transmission local oscillator 100a may ideally output the clock signal CLK_LO having a value in only a certain frequency, but due to circuit design, phase noises (for example, first and second transmission phase noises) PT1 and PT2 may occur in the transmission local oscillator 100a. As the phase noises PT1 and PT2 increase, an undesired spectral leakage component may be largely detected from the RF signal output through the antenna 600. As shown in FIG. 4, when the first transmission phase noise PT1, which is relatively large, is mixed, a first spectral leakage SL1 appears largely. On the other hand, when the second transmission phase noise PT2, which is relatively small, is mixed, a second spectral leakage SL2 appears slightly. Accordingly, the phase noises PT1 and PT2 occurring in the transmission local oscillator 100a may need to be decreased.

An allowable spectral leakage may be defined for each of RF standards, and thus, when transmission power of the power amplifier 500a is relatively high, phase noise of the transmission local oscillator 100a may have a low level. For example, when the transmission power is high, a spectral leakage may exceed an allowable value, and thus, the phase noise of the transmission local oscillator 100a may have a low level. On the other hand, when the transmission power of the power amplifier 500a is relatively low, the phase noise of the transmission local oscillator 100a may have a large value.

Referring again to FIG. 3, when the phase noise of the transmission local oscillator 100a has a large value, the driving voltage V_IN provided by a voltage regulator 120a may have a small value. This is because the driving voltage V_IN provided to a divider 130a and a buffer 140a is inversely proportional to the phase noise. In other words, it is not required to increase the driving voltage V_IN for the phase noise to always have a minimum value. Accordingly, a voltage selector 110a may provide the selection voltage V_SEL optimized for providing the divider 130a and the buffer 140a with the driving voltage V_IN having power consumption efficiency optimized based on transmission power.

Figure 5:
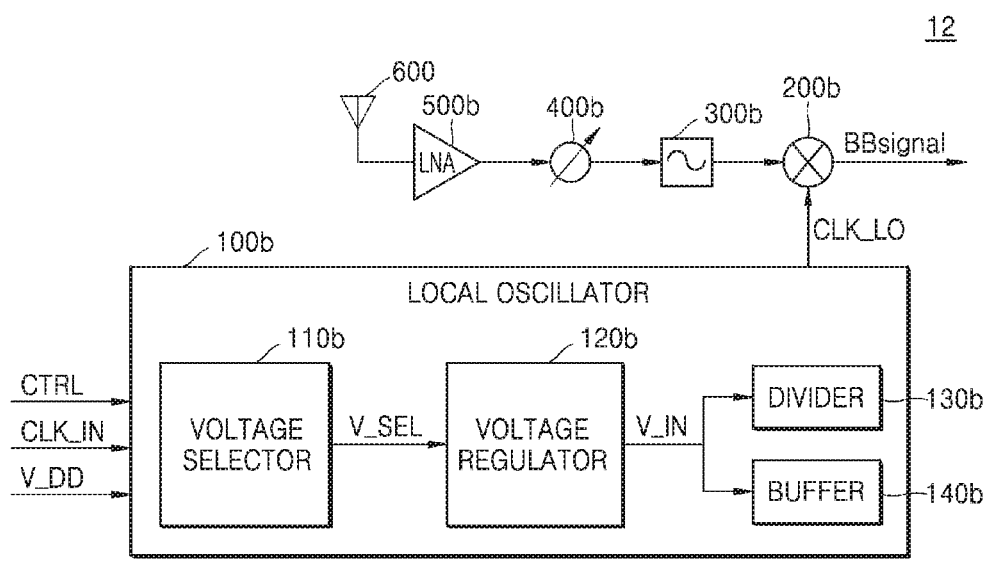
FIG. 5 is a block diagram for describing a local oscillator of a reception circuit according to an exemplary embodiment of the inventive concept.

FIG. 5 is a block diagram for describing a local oscillator of a reception circuit according to an exemplary embodiment of the inventive concept.

Referring to FIG. 5, the reception circuit 12 may include a reception local oscillator 100b, a mixer 200b, a filter 300b, a phase shifter 400b, and a power noise amplifier (LNA) 500b. The reception local oscillator 100b may perform an operation which is the same as or similar to the local oscillator 100 described above with reference to FIG. 2, and thus, repetitive descriptions will be omitted.

The mixer 200b may mix a signal based on an RF signal received from the outside with the clock signal CLK_LO output from the reception local oscillator 100b to output the baseband signal (BB signal). For example, the mixer 200b may perform frequency down-conversion on the signal based on the RF signal by using the clock signal CLK_LO.

The LNA 500b may have a reception gain based on control by the control logic 13 of FIG. 1, and may adjust a level of an RF signal received from the antenna 600 to output a level-adjusted RF signal. In detail, the control logic 13 may control the reception gain of the LNA 500b, based on information which is provided by the modem 20 and is used to set the reception gain.

Figure 6:
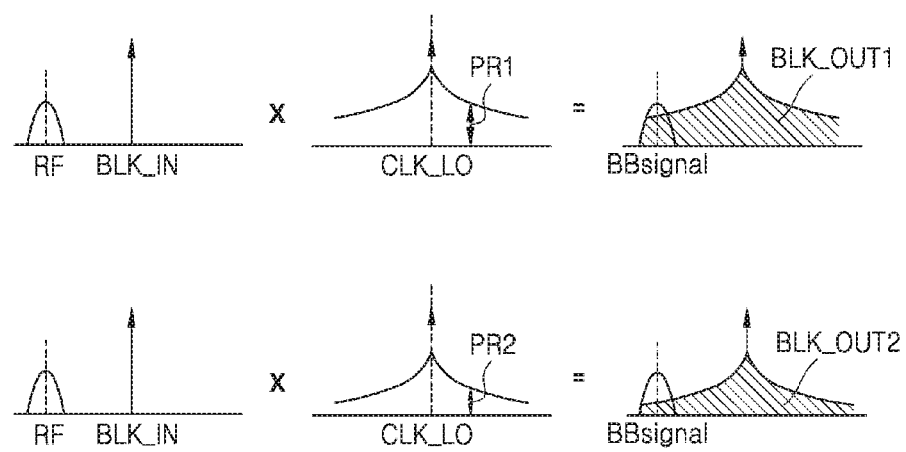
FIG. 6 is a diagram for describing a phase noise-based effect of a reception circuit according to an exemplary embodiment of the inventive concept.

FIG. 6 is a diagram for describing a phase noise-based effect of a reception circuit according to an exemplary embodiment of the inventive concept. For convenience, the following description will be given with reference to reference numerals of FIG. 5.

Referring to FIG. 6, the mixer 200b may mix a signal of an RF band with the clock signal CLK_LO to output the baseband signal (BB signal). In FIG. 6, the abscissa axis of a graph represents frequency, and the ordinate axis represents power.

The reception local oscillator 100b may ideally output the clock signal CLK_LO having a value in only a certain frequency, but phase noises (for example, first and second reception phase noises) PR1 and PR2 may occur in the reception local oscillator 100b. As the phase noises PR1 and PR2 increase, aliasing (for example, first blocker aliasing and second blocker aliasing) BLK_OUT1 and BLK_OUT2 caused by a blocker may be largely detected. As shown in FIG. 6, when the first reception phase noise PR1, which is relatively large, is mixed, the first blocker aliasing BLK_OUT1 appears largely. On the other hand, when the second reception phase noise PR2, which is relatively small, is mixed, the second blocker aliasing BLK_OUT2 appears slightly. Accordingly, the phase noises PR1 and PR2 occurring in the reception local oscillator 100b may need to be decreased.

In a case where a blocker level is high, when the phase noise of the reception local oscillator 100b is sufficiently small, a sensitivity of the baseband signal (BB signal) is prevented from being degraded. On the other hand, in a case where the blocker level is low, even when the phase noise of the reception local oscillator 100b has a large value, the sensitivity of the baseband signal (BB signal) is prevented from being excessively degraded.

Referring again to FIG. 5, when the phase noise of the reception local oscillator 100b has a large value, the driving voltage V_IN provided by a voltage regulator 120b may have a small value. In other words, it is not required to increase the driving voltage V_IN for the phase noise to always have a minimum value. Accordingly, a voltage selector 110b may provide the selection voltage V_SEL optimized for providing a divider 130b and a buffer 140b with the driving voltage V_IN having power consumption efficiency optimized based on the blocker level.

Figure 7:
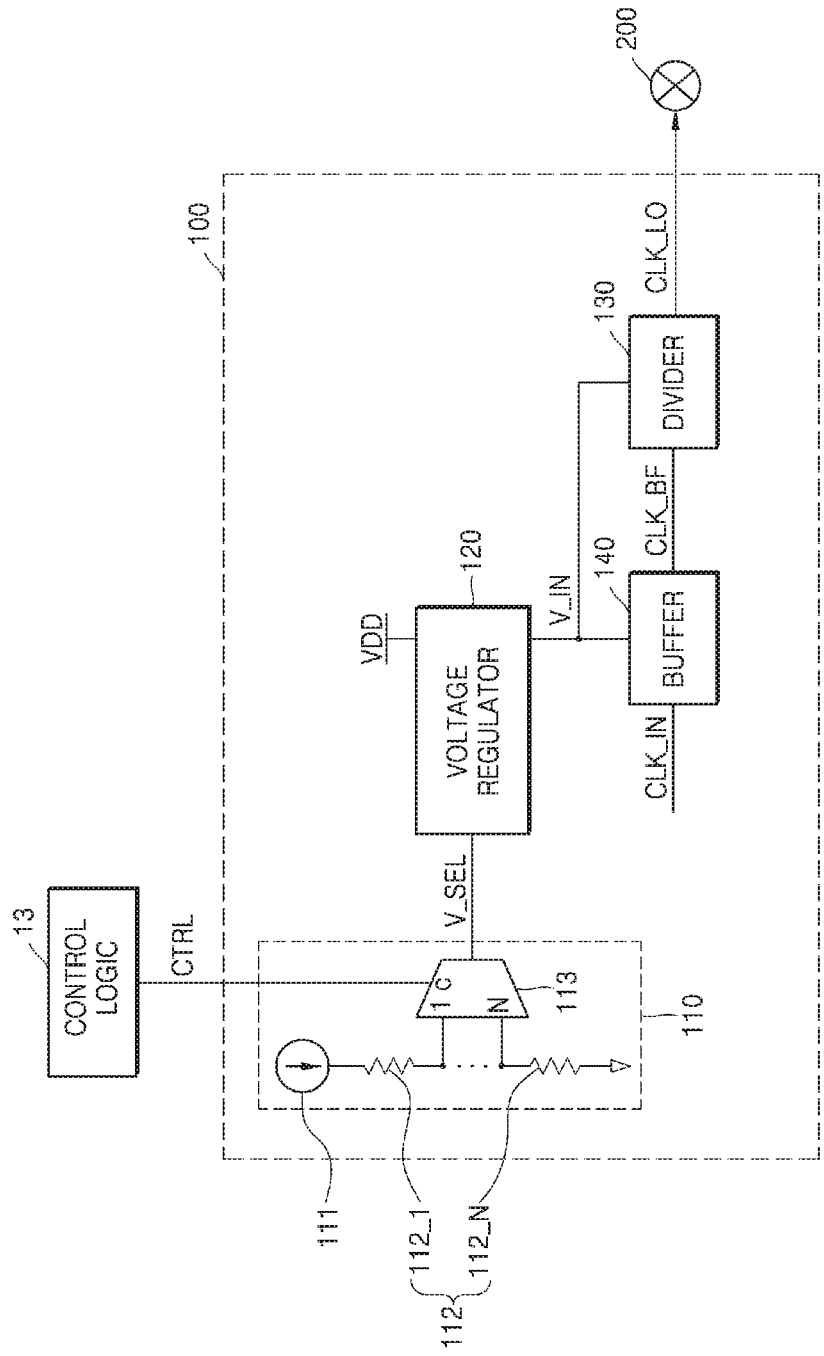
FIG. 7 is a block diagram for describing a local oscillator according to an exemplary embodiment of the inventive concept.

FIG. 7 is a block diagram for describing a local oscillator according to an exemplary embodiment of the inventive concept.

Referring to FIG. 7, the local oscillator 100 may include the voltage selector 110, the voltage regulator 120, the divider 130, and the buffer 140. The voltage selector 110 may include a current source 111, a plurality of resistors 112, and a multiplexer 113.

The voltage selector 110 may provide the selection voltage V_SEL to the voltage regulator 120 according to the control signal CTRL of the control logic 13. According to an exemplary embodiment of the inventive concept, the current source 111 may supply a current to the plurality of resistors 112 serially connected to one another. N number of resistors 112 may be serially connected to one another, and first to N$^{th}$ (where N is an integer greater than or equal to two) resistors 112_1 to 112_N included in the plurality of resistors 112 may be serially connected to the current source 111. The multiplexer 113 may include first to N$^{th}$ input terminals 1 to N and a control terminal C. The multiplexer 113 may output, as the selection voltage V_SEL, a voltage of one of the nodes connected to the first to N$^{th}$ input terminals 1 to N according to the control signal CTRL received through the control terminal C. However, the voltage selector 110 is not limited thereto. In exemplary embodiments of the inventive concept, the voltage selector 110 may provide a plurality of selection voltages V_SEL having different levels according to the control signal CTRL.

The voltage regulator 120 may provide the divider 130 and the buffer 140 with the driving voltage V_IN generated by regulating a source voltage VDD, based on the selection voltage V_SEL. For example, the voltage regulator 120 may be implemented with a low drop output (LDO) regulator.

Therefore, the voltage regulator 120 may provide the driving voltage V_IN based on a level of the selection voltage V_SEL. Additionally, the voltage regulator 120 may provide the same driving voltage V_IN to the buffer 140 and the divider 130, and thus, the divider 130 and the buffer 140 may have the same operation point, whereby a duty cycle of the clock signal CLK_LO output from the divider 130 may be maintained at 50%. In other words, since the buffer 140 and the divider 130 are supplied with the same driving voltage V_IN, an influence of a variation of the driving voltage V_IN on the duty cycle of the clock signal CLK_LO may be minimized.

Figure 8:
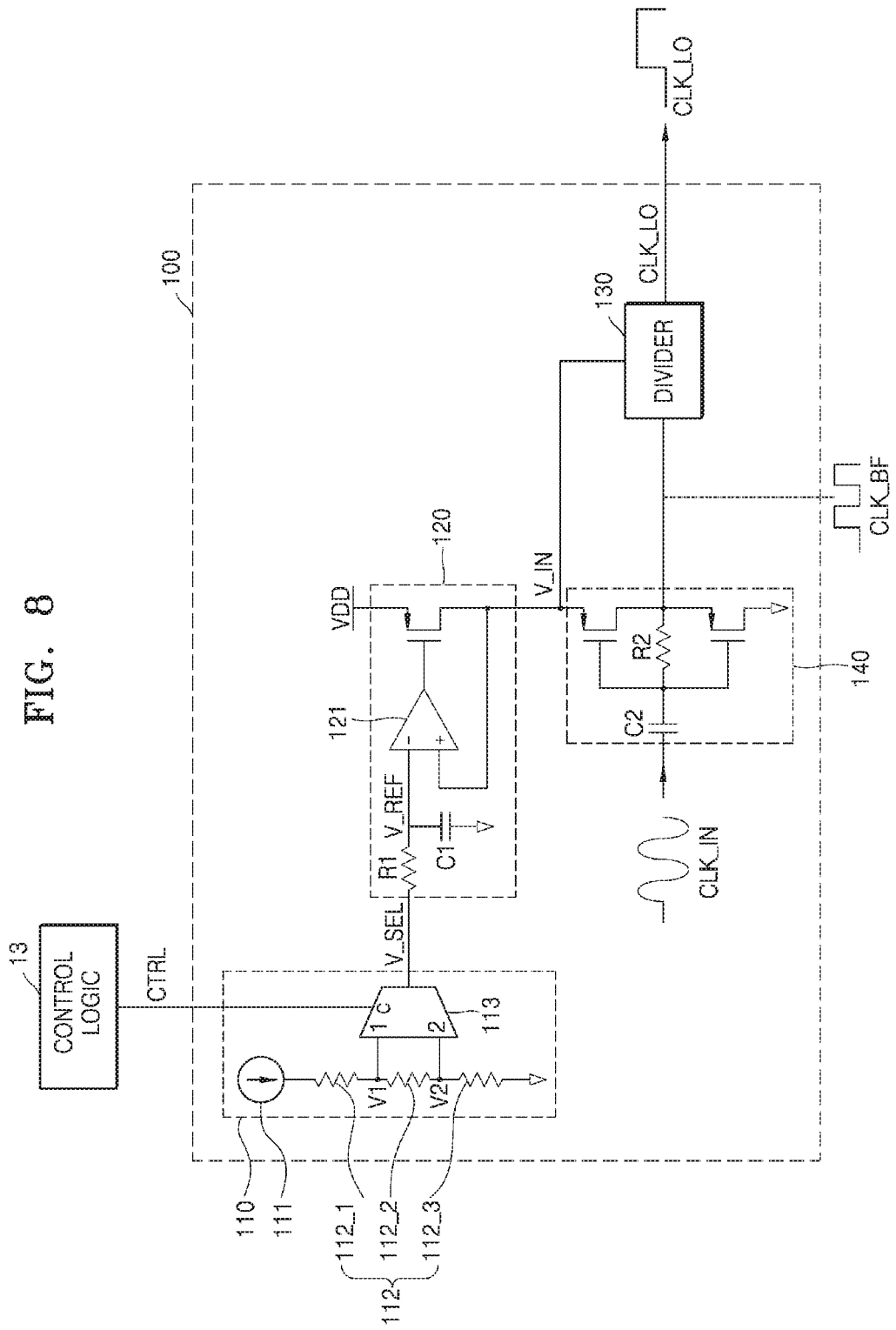
FIG. 8 is a detailed block diagram for describing a local oscillator according to an exemplary embodiment of the inventive concept.

FIG. 8 is a detailed block diagram for describing a local oscillator according to an exemplary embodiment of the inventive concept.

Referring to FIG. 8, the plurality of resistors 112 included in the voltage selector 110 may include a first resistor 112_1, a second resistor 112_2, and a third resistor 112_3, and the voltage regulator 120 may include an operational amplifier 121, a resistor R1, and a capacitor C1. A buffer 140 may include a resistor R2, a capacitor C2, and at least one transistor.

According to an exemplary embodiment of the inventive concept, the voltage selector 110 may receive the control signal CTRL from the control logic 13 to select one voltage from among a first voltage V1 and a second voltage V2 respectively applied to a first input terminal 1 and a second input terminal 2 of the multiplexer 113, and may output the selected one voltage as the selection voltage V_SEL. The second voltage V2 may be a voltage obtained by multiplying a resistance value of the third resistor 112_3 and a current applied by the current source 111, and the first voltage V1 may be a voltage obtained by multiplying the current and a sum of resistance values of the second and third resistors 112_2 and 112_3. Therefore, in response to the control signal CTRL of the control logic 13 for allowing a high voltage to be output, the multiplexer 113 may output the first voltage V1 as the selection voltage V_SEL, and in response to the control signal CTRL of the control logic 13 for allowing a low voltage to be output, the multiplexer 113 may output the second voltage V2 as the selection voltage V_SEL.

The voltage regulator 120 may provide the driving voltage V_IN to the buffer 140 and the divider 130, based on a reference voltage V_REF applied to an inverting terminal of the operational amplifier 121. The reference voltage V_REF may be determined based on the selection voltage V_SEL. For example, the reference voltage V_REF may be determined based on the selection voltage V_SEL, and for example, may be a voltage which is generated by performing low pass filtering on the selection voltage V_SEL by using the resistor R1 and the capacitor C1.

The buffer 140 may have an operation point determined based on the driving voltage V_IN and may provide the divider 130 with a clock buffer signal CLK_BF obtained by buffering the clock source signal CLK_IN. The buffering may denote an operation of converting a sine wave into a square wave to adjust a level. For example, as in a waveform shown in FIG. 8, the clock buffer signal CLK_BF may correspond to a square wave where a logic low voltage and a logic high voltage are alternately repeated based on the operation point of the buffer 140. In other words, in the clock source signal CLK_IN having a sine wave, a voltage higher than or equal to an operation point may have a logic high voltage having a constant value, and a voltage lower than an operation point may have a logic low voltage having a constant value.

The divider 130 may receive the clock buffer signal CLK_BF and may divide a frequency to provide the clock signal CLK_LO having a certain value to a mixer. In this case, a duty cycle of the clock signal CLK_LO output from the divider 130 may be about 50%.

The divider 130 may be provided with substantially the same voltage as the driving voltage V_IN provided to the buffer 140. In detail, terminals, provided with the driving voltage V_IN, of the buffer 140 and the divider 130 may share one node. Therefore, even when the driving voltage V_IN varies slightly, an operation point of the buffer 140 and an operation point of the divider 130 may vary in substantially the same manner, and thus, the duty cycle of the clock signal CLK_LO output from the divider 130 may be maintained at a certain value (for example, 50%).

Figure 9:
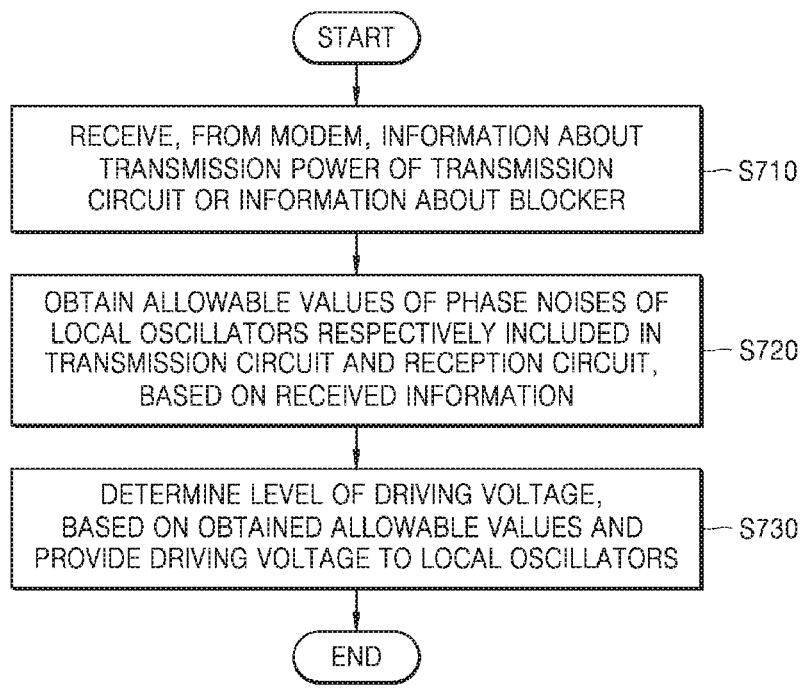
FIG. 9 is a flowchart for describing an operating method of a radio frequency integrated circuit (RFIC) according to an exemplary embodiment of the inventive concept.

FIG. 9 is a flowchart for describing an operating method of an RFIC according to an exemplary embodiment of the inventive concept.

In operation S710, the RFIC 10 including the transmission circuit 11 and the reception circuit 12 may receive an operating condition from the modem 20. In detail, the RFIC 10 may receive, from the modem 20, information for setting transmission power, and the control logic 13 may determine the transmission power of the transmission circuit 11. Additionally, the RFIC 10 may receive, from the modem 20, information for setting a reception gain, and the control logic 13 may determine the reception gain of the reception circuit 12.

In operation S720, the RFIC 10 may calculate allowable values of phase noises of the local oscillators 100a and 100b respectively included in the transmission circuit 11 and the reception circuit 12, based on the operating condition. For example, the control logic 13 may calculate the allowable value of the phase noise occurring in the transmission local oscillator 100a, based on the transmission power of the transmission circuit 11. As another example, the control logic 13 may calculate the allowable value of the phase noise occurring in the reception local oscillator 100b, based on the reception gain of the reception circuit 12.

In operation S730, the RFIC 10 may determine a driving voltage, based on the calculated allowable values of the phase noises, and may provide the driving voltage to the local oscillators 100a and 100b. For example, when the allowable values of the phase noises are high, the control logic 13 may control the voltage selector 110 to provide a low driving voltage, and when the allowable values of the phase noises are low, the control logic 13 may control the voltage selector 110 to provide a high driving voltage.

Figure 10:
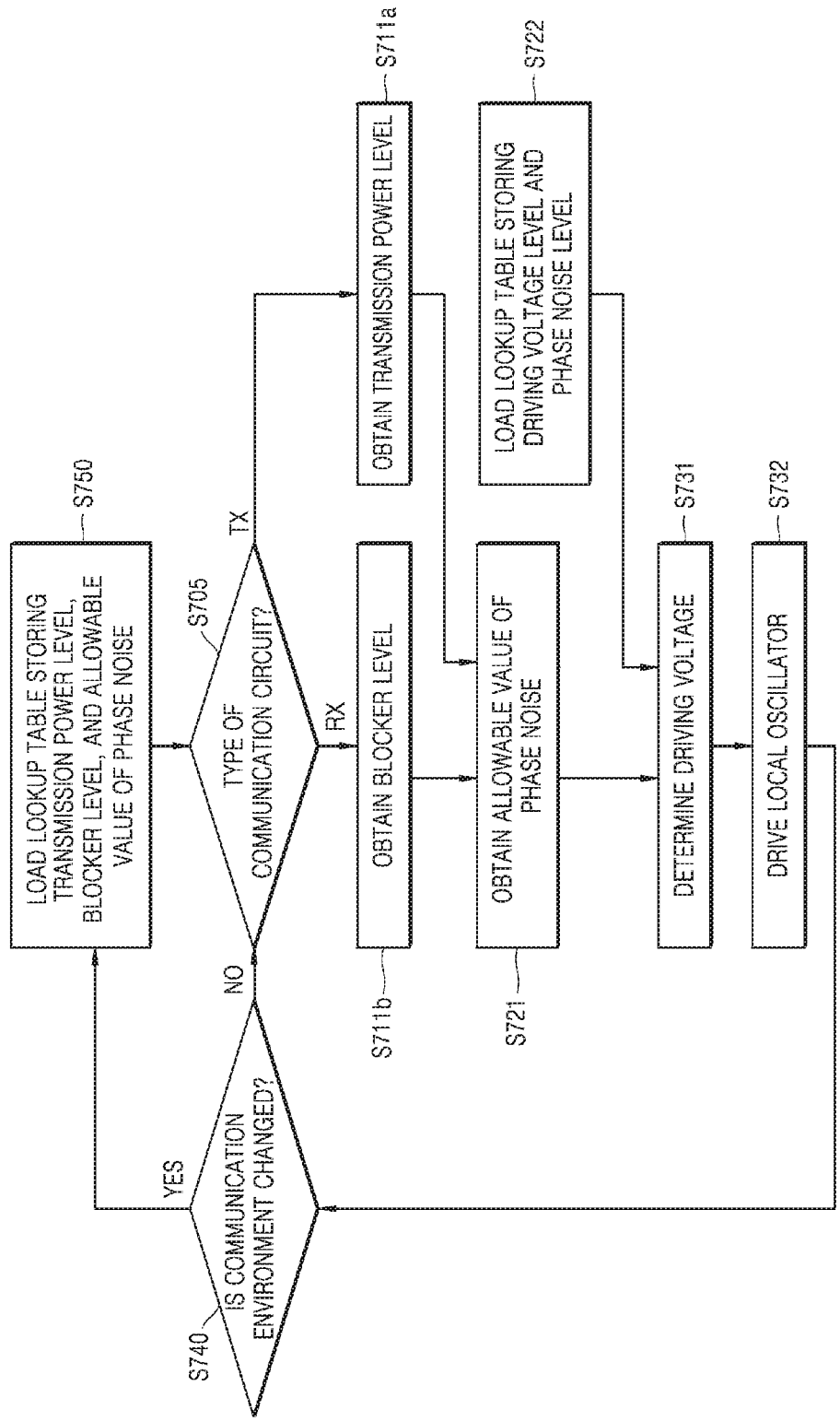
FIG. 10 is a detailed flowchart for describing an operating method of an RFIC according to an exemplary embodiment of the inventive concept.

FIG. 10 is a detailed flowchart for describing an operating method of an RFIC according to an exemplary embodiment of the inventive concept.

According to an exemplary embodiment of the inventive concept, the RFIC 10 may include the transmission circuit 11 and the reception circuit 12. In operation S705, the control logic 13 may determine a type of communication circuit, e.g., the transmission circuit 11 (TX) or the reception circuit 12 (RX). The control logic 13 may obtain transmission power level of the transmission circuit 11 in operation S711a and may calculate an allowable value of phase noise of the transmission circuit 11, based on the obtained transmission power level in operation S721. Additionally, the control logic 13 may obtain a blocker level of the reception circuit 12, based on information for setting a reception gain in operation S711b and may calculate an allowable value of phase noise of the reception circuit 12, based on the obtained blocker level in operation S721.

For example, the control logic 13 may obtain the transmission power level, based on information which is used to set transmission power and received from the modem 20, or may monitor a level of the transmission power to obtain the transmission power level. As another example, the control logic 13 may obtain a blocker level by processing information which is used to set a reception gain and received from the modem 20, or may directly measure the blocker level from the antenna 600 or a blocker sensing unit.

In operation S721, the RFIC 10 may calculate the allowable values of the phase noises. For example, the control logic 13 may calculate an allowable value of phase noise which is inversely proportional to the transmission power level and occurs in the transmission local oscillator 100a. Additionally, the control logic 13 may calculate an allowable value of phase noise which is inversely proportional to the blocker level and occurs in the reception local oscillator 100b.

According to an exemplary embodiment of the inventive concept, the control logic 13 may load a lookup table from the memory 14 to calculate an allowable value of phase noise. For example, the control logic 13 may load, from the memory 14, a second lookup table where transmission power level is mapped to an allowable value of phase noise and a third lookup table where a blocker level is mapped to the allowable value of the phase noise, thereby calculating an allowable value of phase noise. In operation S722, the control logic 13 may load a first lookup table, where a phase noise level is mapped to the driving voltage V_IN level, from the memory 14. In detail, a local oscillator according to the above-described exemplary embodiments may be designed, and the first lookup table may store data of a level of phase noise occurring in the designed local oscillator with respect to the driving voltage V_IN level.

According to an exemplary embodiment of the inventive concept, the first lookup table may store a phase noise level and the source voltage VDD level mapped to each other. However, a level of the source voltage VDD and a level of the driving voltage V_IN may have a difference equal to a voltage drop occurring in a transistor connected to an output terminal of the operational amplifier 121, and the source voltage VDD and the driving voltage V_IN may have similar levels.

Subsequently, the control logic 13 may determine the driving voltage V_IN by using the calculated allowable values of the phase noises and the first lookup table in operation S731, and may transmit the control signal CTRL to the voltage selector 110 for the voltage regulator 120 to output the determined driving voltage V_IN.

According to an exemplary embodiment of the inventive concept, the determined driving voltage V_IN may be provided to the buffer 140 and the divider 130, the local oscillator 100 may be driven subsequently in operation S732, and then, a communication environment may be changed in operation S740. When the communication environment is changed (YES), a new transmission power level and a new reception gain based on a changed communication environment may be needed. Additionally, a frequency used by the RFIC 10 may vary based on the changed communication environment, and thus, a frequency of a blocker may vary, whereby a level of the blocker may vary. When information for setting the new transmission power level and information about a new blocker are received from the modem 20, the control logic 13 may load the second and third lookup tables suitable for the changed communication environment in operation S750, and may again calculate an allowance value of phase noise. Accordingly, the driving voltage V_IN applied to the divider 130 and the buffer 140 may be again determined.

When the communication environment is not changed (NO), the control logic 13 may obtain a transmission power level and a blocker level at every predetermined period in operations S711a and S711b to calculate an allowable value of phase noise in operation S721.

Figure 11:
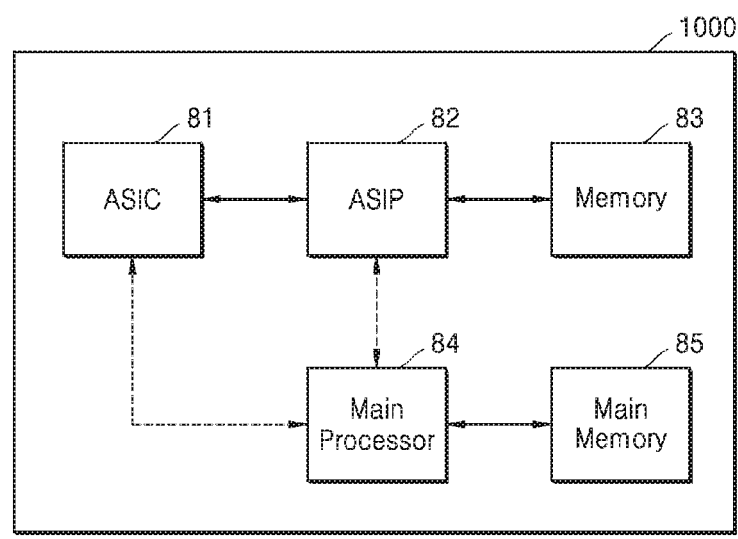
FIG. 11 is a block diagram for describing a communication apparatus according to an exemplary embodiment of the inventive concept.

FIG. 11 is a block diagram for describing a communication apparatus according to an exemplary embodiment of the inventive concept.

Referring to FIG. 11, a communication apparatus 1000 may include an application specific integrated circuit (ASIC) 81, an application specific instruction set processor (ASIP) 82, a memory 83, a main processor 84, and a main memory 85. Two or more of the ASIC 81, the ASIP 82, and the main processor 84 may communicate with one another. Additionally, two or more of the ASIC 81, the ASIP 82, the memory 83, the main processor 84, and the main memory 85 may be integrated into one chip.

The ASIP 82, an integrated circuit (IC) customized for a certain purpose, may support an instruction set dedicated for a certain application and may execute instructions included in the instruction set. The memory 83, a non-transitory storage device, may communicate with the ASIP 82 and may store a plurality of instructions executed by the ASIP 82. Examples of the memory 83 may include random access memory (RAM), read-only memory (ROM), a tape, a magnetic disk, an optical disk, a volatile memory, a non-volatile memory, or a combination thereof, and may include an arbitrary type of memory accessible by the ASIP 82.

The main processor 84 may execute a plurality of instructions to control the communication apparatus 1000. For example, the main processor 84 may control the ASIC 81 and the ASIP 82, and may process data received through a multi-input multi-output (MIMO) channel or may process a user input applied to the communication apparatus 1000. The main memory 85, a non-transitory storage device, may communicate with the main processor 84 and may store a plurality of instructions executed by the main processor 84. Examples of the main memory 85 may include RAM, ROM, a tape, a magnetic disk, an optical disk, a volatile memory, a non-volatile memory, or a combination thereof, and may include an arbitrary type of memory accessible by the main processor 84.

The operating method of the RFIC, which provides a driving voltage to the local oscillator according to the above-described exemplary embodiments of the inventive concept, may be performed by at least one of the elements included in the communication apparatus 1000 of FIG. 11. For example, the control logic 13 may include at least one of the ASIC 81, the ASIP 82, and the main processor 84 of FIG. 18. In exemplary embodiments of the inventive concept, at least one of processes of a method of compensating for the nonlinearity of the above-described transmission circuit may be implemented as a plurality of instructions stored in the memory 83. In exemplary embodiments of the inventive concept, the ASIP 82 may execute the plurality of instructions stored in the memory 83 to perform at least one of processes of the operating method of the RFIC. In exemplary embodiments of the inventive concept, at least one of the processes of the operating method of the RFIC may be implemented as a hardware block designed based on a logic combination and may be included in the ASIC 81. In exemplary embodiments of the inventive concept, at least one of the processes of the operating method of the RFIC may be implemented as a plurality of instructions stored in the main memory 85, and the main processor 84 may execute the plurality of instructions stored in the main memory 85 to perform at least one of the processes of the operating method of the RFIC.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. An operating method of a radio frequency integrated circuit (RFIC) comprising a transmission circuit and a reception circuit, the operating method comprising:
   receiving, from a modem, first information for setting transmission power of the transmission circuit and second information about a blocker which is a frequency signal unused by the RFIC;
   obtaining an allowable value of phase noise of a local oscillator included in the transmission circuit, using the first information, and obtaining an allowable value of phase noise of a local oscillator included in the reception circuit, using the second information; and
   determining a level of a driving voltage, using the obtained allowable values of the phase noises, and providing the driving voltage to the local oscillators;
   wherein, as the transmission power increases, the driving voltage output by the voltage regulator is increased, and as the level of the blocker increases, the driving voltage output by the voltage regulator is increased.

2. The operating method of claim 1, wherein the providing of the driving voltage comprises providing the driving voltage to a divider and a buffer included in each of the local oscillators.

3. The operating method of claim 2, wherein the second information comprises information about a level of the blocker.

4. The operating method of claim 3, wherein the providing of the driving voltage comprises decreasing the driving voltage as the level of the blocker obtained from the second information decreases.

5. The operating method of claim 3, further comprising setting the transmission power of the transmission circuit, using the first information, wherein the allowable value of the phase noise of the local oscillator comprised in the transmission circuit is obtained using the transmission power.

6. The operating method of claim 3, wherein the providing of the driving voltage comprises decreasing the driving voltage as the obtained allowable values of the phase noises increase.

7. The operating method of claim 6, wherein the providing of the driving voltage comprises:
   obtaining a driving voltage level based on a phase noise level, using a first lookup table where the phase noise level of each of the local oscillators respectively included in the transmission circuit and the reception circuit is mapped to a driving voltage level; and
   providing the driving voltage having the obtained driving voltage level to the buffer and the divider.

8. The operating method of claim 6, further comprising:
   detecting a communication environment; and
   re-obtaining the allowable values of the phase noises by using the transmission power of the transmission circuit and a level of the blocker based on the communication environment, if the communication environment is changed.

9. The operating method of claim 8, wherein the re-obtaining of the allowable values comprises re-obtaining the allowable values of the phase noises, using a second lookup table where transmission power level is mapped to an allowable value of phase noise and a third lookup table where a level of the blocker is mapped to an allowable value of the phase noise.

10. The operating method of claim 8, further comprising, obtaining a level of the transmission power at a predetermined period to calculate an allowable value of phase noise and obtaining the level of the blocker at the predetermined period to calculate an allowable value of phase noise, if the communication environment is not changed.

11. A local oscillator for providing a clock signal for a frequency conversion operation of a transmission circuit or a reception circuit, the local oscillator comprising:
   a buffer configured to receive and buffer a clock source signal to provide a clock buffer signal;
   a divider configured to divide the clock buffer signal to provide a clock signal to a mixer;
   a voltage selector configured to output a selection voltage, based on transmission power of the transmission circuit or a level of a blocker which is a frequency signal unused by the transmission circuit and the reception circuit; and
   a voltage regulator configured to provide the buffer and the divider with a driving voltage based on the selection voltage;
   wherein, as the transmission power increases, the driving voltage output by the voltage regulator is increased, and as the level of the blocker increases, the driving voltage output by the voltage regulator is increased.

12. The local oscillator of claim 11, wherein
   the voltage regulator comprises a low drop output (LDO) regulator, and
   the driving voltage has a value obtained by regulating a source voltage provided to the voltage regulator, based on the selection voltage.

13. The local oscillator of claim 11, wherein the buffer and the divider have the same operation points, based on the driving voltage.

14. A radio frequency integrated circuit (RFIC) comprising:
   a local oscillator comprising a buffer configured to receive and buffer a clock source signal to provide a clock buffer signal, a divider configured to divide the clock buffer signal to provide a clock signal to a mixer, and a voltage selector configured to control a driving voltage provided to the buffer and the divider; and
   a control logic configured to control the voltage selector to generate the driving voltage that varies based on an allowable value of phase noise of the clock signal according to changing at least one of a power level of a transmitter and a level of a blocker;
   wherein, as the transmission power increases, the driving voltage output by the voltage regulator is increased, and as the level of the blocker increases, the driving voltage output by the voltage regulator is increased.

15. The RFIC of claim 14, further comprising a reception circuit comprising the local oscillator,
   wherein the control logic calculates the allowable value of the phase noise of the local oscillator and controls the voltage selector to provide the driving voltage based on the calculated allowable value.

16. The RFIC of claim 15, wherein the control logic calculates the allowable value of the phase noise, based on a level of a blocker received by the reception circuit.

17. The RFIC of claim 16, wherein, as the allowable value increases, the driving voltage decreases.

18. The RFIC of claim 16, wherein the control logic obtains the level of the blocker, based on information for setting a reception gain of the reception circuit received from a modem.

19. The RFIC of claim 16, wherein, when information indicating that a communication standard has been changed is received, the control logic recalculates the allowable value of the phase noise of the local oscillator.

* * * * *